US006281121B1

United States Patent
Brown et al.

(10) Patent No.: US 6,281,121 B1
(45) Date of Patent: *Aug. 28, 2001

(54) DAMASCENE METAL INTERCONNECTS USING HIGHLY DIRECTIONAL DEPOSITION OF BARRIER AND/OR SEED LAYERS INCLUDING (III) FILLING METAL

(75) Inventors: Dirk Dewar Brown, Santa Clara; Takeshi Nogami, Sunnyvale; Guarionex Morales, Santa Clara, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/036,127

(22) Filed: Mar. 6, 1998

(51) Int. Cl.⁷ .................................................. H01L 21/44
(52) U.S. Cl. .......................... 438/672; 438/633; 438/637; 438/638
(58) Field of Search .................................. 438/633, 637, 438/638, 672; 257/758

(56) References Cited

U.S. PATENT DOCUMENTS

| | | | | |
|---|---|---|---|---|
| 5,585,673 | * | 12/1996 | Joshi et al. | 257/751 |
| 5,821,168 | * | 10/1998 | Jain | 438/692 |
| 5,840,625 | * | 11/1998 | Feldner | 438/626 |
| 5,882,399 | * | 3/1999 | Ngan et al. | 117/89 |
| 5,920,790 | * | 7/1999 | Wetzel et al. | 438/618 |
| 5,929,526 | * | 7/1999 | Srinivasan et al. | 257/768 |
| 6,001,736 | * | 12/1999 | Kondo et al. | 438/677 |
| 6,043,153 | * | 3/2000 | Nogami et al. | 438/687 |

OTHER PUBLICATIONS

Stanley Wolf Ph.D. in Silicon Processing for the VLSI Era, vol. 2: Process Integration, Lattice Press, 1990.*
Article entitled, "Polycrystalline Thin Films—Structure, Texture, Properties and Applications III", Author: Besser et al.
Article entitled, "Advanced Metallization and Interconnect Systems for ULSI Applications in 1996", Author: Havemann et al.

* cited by examiner

*Primary Examiner*—Charles Bowers
*Assistant Examiner*—William M. Brewster
(74) *Attorney, Agent, or Firm*—Eschweiler & Associates, LLC

(57) ABSTRACT

An improved damascene metal interconnect for use in a semiconductor integrated circuit. By using highly directional deposition of barrier and/or seed layers the texture of the damascene structure is improved. A first barrier metal layer is deposited in a standard deposition manner, and a second barrier metal is then applied in a highly directional manner. For example, tungsten, titanium and tantalum nitrides can be used as barrier metals. Copper or aluminum based metal is deposited over the second barrier metal, and is then polished by using a chemical mechanical polish. A passivation layer can then be deposited over the interconnect.

38 Claims, 2 Drawing Sheets

DAMASCENE METAL INTERCONNECTS USING HIGHLY DIRECTIONAL DEPOSITION OF BARRIER AND/OR SEED LAYERS INCLUDING (III) FILLING METAL

BACKGROUND OF THE INVENTION

As semiconductor device geometries continue to scale down below 0.5 um and approach 0.18 um minimum feature size, the metal interconnect lines which carry current between devices on a chip begin to dominate the overall circuit speed. In order to enhance interconnect speed and reliability, the semiconductor industry is moving away from blanket deposition and etch of aluminum-based metalizations, and towards damascene and dual-damascene interconnect structures with copper-based metalizations. One reason for this movement is that copper is a lower resistivity metal than aluminum, which results in a lower RC interconnect delay. Copper has also been shown to have superior electromigration performance compared to aluminum. However, copper is more difficult to process, primarily because it is more difficult to etch and it acts as a deep level trap in silicon-based devices.

The typical way to process copper interconnects in a semiconductor device is to (i) etch a trench or via into a dielectric material, (ii) deposit the interconnect metalization to fill the trench or via, and then (iii) polish the metal back to remove any metal from the field (i.e., the surface of the semiconductor wafer). The resulting metal-filled trenches or vias form the electrical interconnect. Forming an interconnect structure by filling a trench or via with metal is known as a "damascene" process. If a trench and underlying via are filled simultaneously, it is known as a dual-damascene process.

The crystallographic texture of metal interconnects can correlate very strongly to electromigration reliability. Aluminum and copper-based metal lines with strong (111) texture show better electromigration performance. Strong texture can be obtained by using, a refractory underlying metal. For example, titanium is often used a barrier/shunt layer under aluminum metalizations because the (0002) texture of the titanium induces a strong (111) texture in the overlaying aluminum-based film. In a similar way, the (0002) texture of tantalum can improve the (111) texture of copper-based metalizations. Copper interconnects with (111) texture thus show a tenfold increase in electromigration reliability as compared to randomly oriented or (100) textured copper lines.

A refractory metal such as titanium, titanium nitride, tantalum, tantalum nitride, or tungsten nitride is typically deposited prior to the deposition of aluminum or copper-based metalizations in damascene processing. This barrier layer prevents copper diffusion into the surrounding dielectric and improves the quality of the metal/dielectric interface. In order to obtain adequate step coverage in high aspect ratio trenches and vias, several deposition techniques have been developed to give very directional deposition including, for example, the use of Ionized Metal Plasma, high target-to-substrate distance, or Hollow Cathode Magnetron. Typically, these deposition techniques are optimized to give the maximum step coverage on all surfaces inside the damascene structure.

The (111) texture of aluminum-based and copper-based damascene interconnects, however, degrades with decreasing line width. Narrow lines show a (100) component which can be attributed to (111) oriented grains growing from the side of the damascene trench, such that the (100) grain orientation is parallel to the top surface of the trench. Interconnect reliability is negatively affected by the presence of these non-(111) grains. What is lacking in the art is the use of a highly directional barrier metal deposition technique to enhance the texture of the subsequently deposited metalization from only the bottom of a damascene structure (and on the field or surface of the dielectric).

SUMMARY OF THE INVENTION

In view of the above, an improved damascene metal interconnect, and method for forming the improved damascene metal interconnect, is provided. According to the method of the invention, a damascene structure is first etched into a dielectric material. A first barrier material is then deposited over the damascene structure in a manner to ensure maximized bottom and side wall coverage. A second barrier material is then deposited using a highly directional deposition technique to provide very little side wall coverage. A metalization layer is then deposited over the damascene structure, and a chemical mechanical polish is used to form the interconnect structure. The metalization layer can be either aluminum or copper-based.

The improved damascene metal interconnect includes a dielectric material, and a damascene structure etched in the dielectric material. A first barrier material is deposited on the damascene structure to ensure maximized bottom and side wall coverage. A second barrier material is applied to the first barrier material using a highly directional deposition technique to provide very little side wall coverage. A metalization layer is then deposited over the damascene structure, which can be polished using a chemical mechanical polish. The metalization layer can comprise either aluminum or copper-based metal.

The present invention provides improved texture of damascene interconnects, which can be correlated to improved electromigration reliability. In addition, the invention provides improvements to via contact resistance (analogous to graded ARC) with minimum impact on via diameter. These and other features and advantages of the invention will become apparent upon a review of the following detailed description of the presently preferred embodiments of the invention taken in conjunction with the appended drawings.

DETAILED DESCRIPTION OF THE PRESENTLY PREFERRED EMBODIMENTS OF THE INVENTION

Figure 1:
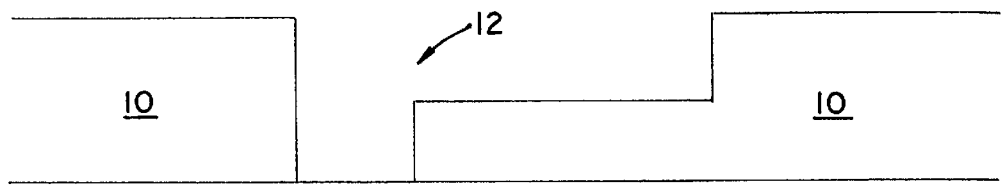
FIG. 1 shows a damascene structure etched into a dielectric material.
Figure 2:
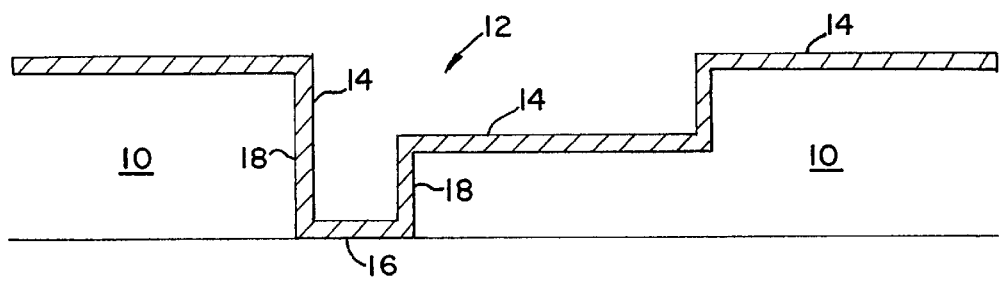
FIG. 2 shows a barrier material deposited on the damascene structure shown in FIG. 1, with maximized bottom and side wall coverage.

Referring now to the drawings, where like elements are designated by like reference numerals throughout, a damascene structure 12 etched in a dielectric material 10 is shown in FIG. 1. As those skilled in the art will appreciate, the dielectric material 10 can comprise silicon dioxide or any other suitable materials that insulate metal lines from each other. A barrier material layer 14 is deposited in a manner generally known in the art, as shown in FIG. 2, to provide maximized bottom 16 and side wall 18 coverage. This barrier material 14 is preferably chosen to have good diffusion barrier properties, but poor texture enhancement properties. Examples of such barrier materials 14 may include titanium nitride (TiN), tantalum nitride (TaN), and tungsten nitride (WN).

Figure 3:
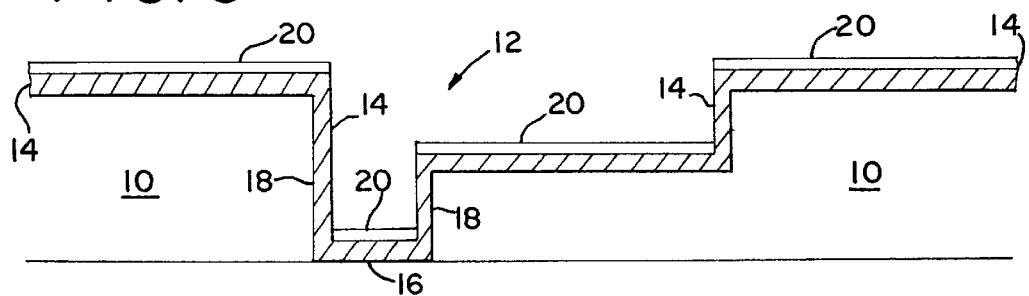
FIG. 3 shows a second barrier material deposited on the damascene structure shown in FIG. 2, where
Figure 3A:
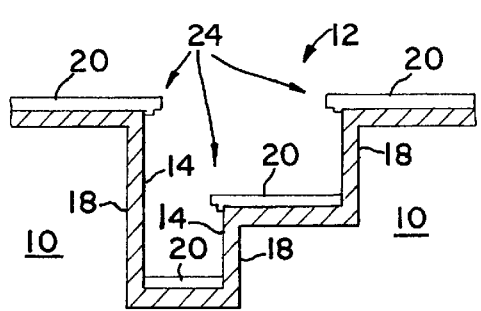
FIG. 3(a) shows an overhang on the sides of the damascene structure.
Figure 3B:
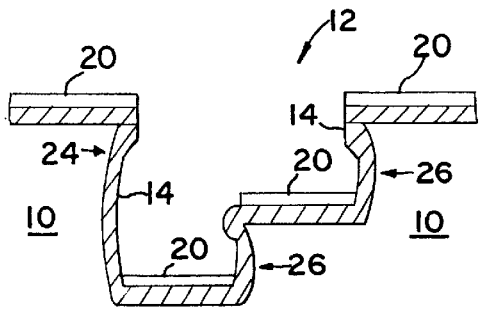
FIG. 3(b) shows the use of a barrel shaped structure.

As shown in FIG. 3, a second barrier material 20 is then deposited using a highly directional deposition technique. By using the highly directional deposition technique, very little coverage is achieved along the side walls 18 of the damascene structure 12. The lack of side wall 18 coverage can further be enhanced by varying certain process conditions such as power, pressure, etc. Results of such variations can yield an overhang 24 condition over the side walls 18 of the damascene structure 12 (see FIG. 3(a)), or an overall 'barrel shaped' 26 appearance to the damascene structure 12 (see FIG. 3(b)).

Figure 4:
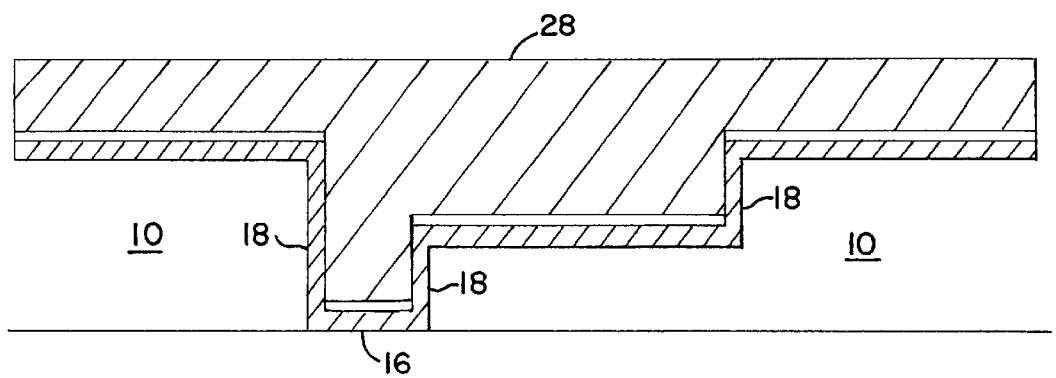
FIG. 4 shows aluminum or copper-based metalization deposited on the structure shown in FIG. 3.

An aluminum or copper-based metalization 28 is deposited into the damascene structure 12 to provide the electrical connection necessary to the structure. Metalization can be deposited by a PVD, CVD, electroplating, or electroless plating process, or a combination of these techniques. The deposited metalization layer 28 is shown in FIG. 4. In addition, some of these techniques can be used to achieve enhanced fill from the bottom 16 of the damascene structure 12, thereby increasing the effect of the (111) texture from the bottom 16 of the structure.

Figure 5:
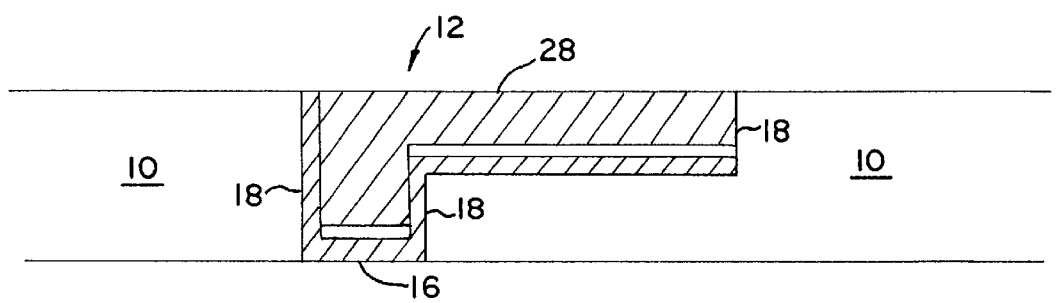
FIG. 5 shows the damascene interconnect structure shown in FIG. 4 after chemical mechanical polish has been applied.
Figure 6:
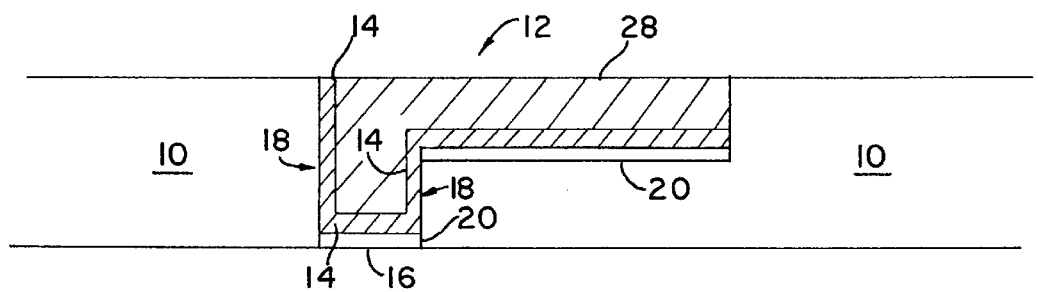
FIG. 6 shows an alternative damascene interconnect structure.

Chemical mechanical polish (CMP) is then used to etch excess metalization 28 in a manner generally known in the art, as shown in FIG. 5. A passivation layer (not shown) can also be applied with the next level of dielectric material (not shown). The (111) texture of the resulting damascene structure can further be enhanced by annealing techniques. An alternative, equivalent structure is shown in FIG. 6. This alternate structure can be formed by depositing the directional, texture-forming metal 20 first, and then depositing the barrier metal 14 within the damascene structure 12. The remaining steps described above would not be altered.

As those skilled in the art will appreciate, several further extensions or modifications to the damascene structure 12 described above are also contemplated. Two examples include:

1. The copper metalization 28 (see FIG. 4) can alternatively be deposited using a PVD copper seed (not shown) followed by copper electroplating. Preferably, the PVD copper seed is highly directional, such that there is very little side wall coverage. As a result, the copper seed can be used to enhance the texture of the interconnect line in one of two ways. If the barrier metal 14 on the side wall 18 does not itself act as a seed for copper plating, but does conduct current to the bottom 16 of the via, the electroplated copper can be grown primarily from the bottom 16 of the damascene structure 12 with (111) oriented texture. The barrier metal 14 thus provides a good interface with the copper (after annealing for example) to maintain good reliability. Alternatively, if the barrier metal 14 on the side wall 18 does act as a suitable seed for copper plating, the electroplated copper will be grown from both the bottom 16 of the damascene structure 12 with (111) oriented texture, as well as from the side walls 18 of the damascene structure 12 typically with random texture. After annealing, the preferred (111) texture in the damascene structure 12 is produced.

2. In shallow damascene structures, the copper metalization can be deposited by PVD techniques only. If this is done in a highly directional manner, the result can yield growth primarily from the bottom 16 of the damascene structure 12. This further provides strong (111) texture induced by the underlying barrier metal 14.

It is to be understood that a wide range of changes and modifications to the embodiments described above will be apparent to those skilled in the art and are contemplated. It is therefore intended that the foregoing detailed description be regarded as illustrative rather than limiting, and that it be understood that it is the following claims, including all equivalents, that are intended to define the spirit and scope of the invention.

We claim:

1. A damascene metal interconnect for a semiconductor integrated circuit, comprising:

a dielectric material;

a damascene structure etched in the dielectric material;

a first barrier material deposited on the damascene structure;

a second barrier material applied to the first barrier material using a highly directional deposition technique, wherein said second barrier material is a refractory metal; and a metalization layer deposited over the damascene structure, wherein said metalization layer consists essentially of a (111) crystal oriented structure, and wherein the metalization layer comprises a member selected from the group consisting of copper, aluminum, and alloys thereof.

2. The improved damascene metal interconnect defined in claim 1, wherein the metalization layer comprises aluminum, or an aluminum alloy.

3. The improved damascene metal interconnect defined in claim 1, wherein the metalization layer comprises copper, or a copper alloy.

4. The improved damascene metal interconnect defined in claim 1, wherein the first barrier material is selected from the group consisting of titanium nitride, tantalum nitride, and tungsten nitride.

5. The improved damascene metal interconnect defined in claim 1, wherein the metalization layer is polished using chemical mechanical polish.

6. The improved damascene metal interconnect defined in claim 1, further comprising an overhang on the side walls of the damascene structure.

7. The improved damascene metal interconnect defined in claim 1, wherein the damascene structure has a barrel shaped appearance.

8. The improved damascene metal interconnect defined in claim 1, further comprising an enhanced fill region disposed at the bottom of the damascene structure.

9. The improved damascene metal interconnect defined in claim 1, further comprising, a passivation layer deposited over the metalization layer.

10. A semiconductor device formed on a semiconductor substrate and comprising:

a dielectric material formed on the semiconductor substrate;

a damascene structure formed in the dielectric material and having a bottom and a side wall;

a first metallic barrier layer deposited on the dielectric material including on the bottom and the side wall of the damascene structure;

a second metallic barrier layer formed by directional deposition on the dielectric material to substantially cover the bottom of the damascene structure with substantially no coverage of the side wall of the damascene structure, wherein said second metallic barrier layer is a refractory metal; and a metalization layer deposited on the dielectric material and filling the damascene structure, wherein the metalization layer consists essentially of a (111) crystal-oriented structure induced by the second metallic barrier layer, and wherein the metalization layer comprises a member selected from the group consisting of copper, aluminum, and alloys thereof.

11. The semiconductor device of claim 10 wherein the damascene structure comprises a trench etched in a surface of the dielectric material.

12. A semiconductor device of claim 10 wherein the first metallic barrier layer is selected from the group consisting of titanium nitride, tantalum nitride and tungsten nitride.

13. The semiconductor device of claim 10 further comprising:

an overhang formed on the side wall of the damascene structure to minimize side wall coverage of the second metallic barrier layer in the damascene structure.

14. The semiconductor device of claim 10 wherein the side wall and bottom of the damascene structure are barrel shaped.

15. The semiconductor device of claim 14 wherein the metallization layer is formed in part by growth from the bottom of the damascene structure.

16. The semiconductor device of claim 14 wherein the metallization layer comprises copper formed by depositing a physical vapor deposition (PVD) copper seed followed by copper electroplating.

17. A damascene metal interconnect with improved (111) texture that is formed in a dielectric material used for a semiconductor integrated circuit, the damascene metal interconnect comprising:

a damascene structure formed in the dielectric material to have a bottom and a side wall;

a refractory metal having texture enhancement properties, wherein the refractory metal is applied to the bottom of the damascene structure using a highly directional deposition technique to achieve almost no coverage of the side wall;

a barrier material having good diffusion barrier properties but poor texture enhancement properties applied with maximum step coverage on the bottom and the side wall of the damascene structure; and a metalization layer applied to overlie the refractory metal and the barrier material, wherein the metalization layer has (111) texture induced by the refractory metal.

18. The damascene metal interconnect of claim 17 wherein the refractory metal is applied to contact the dielectric material that forms the bottom of the damascene structure.

19. The damascene metal interconnect of claim 17 wherein the barrier material is applied to contact the dielectric material that forms the bottom and the side wall of the damascene structure.

20. The damascene metal interconnect of claim 19, wherein the metalization layer is applied to contact the barrier material on the side wall of the damascene structure and is separated by the refractory metal from the barrier material on the bottom of the damascene structure.

21. The damascene metal interconnect of claim 17 wherein the (111) texture of the metalization layer is further enhanced by annealing techniques.

22. The damascene metal interconnect of claim 17 wherein the refractory metal comprises titanium.

23. The damascene metal interconnect of claim 17 wherein the refractory metal comprises tantalum.

24. The damascene metal interconnect of claim 17 wherein the metalization layer comprises copper.

25. The damascene metal interconnect of claim 17 wherein the metalization layer comprises copper alloy.

26. The damascene metal interconnect of claim 17 wherein the metalization layer comprises aluminum.

27. The damascene metal interconnect of claim 17 wherein the metalization layer comprises aluminum alloy.

28. The damascene metal interconnect of claim 17 wherein the metalization layer is grown primarily from the bottom of the damascene structure.

29. A damascene metal interconnect, comprising:

a dielectric material;

a damascene structure in the dielectric material, the damascene structure comprising a bottom and a side wall;

a first barrier material on the damascene structure;

a seed layer over the bottom of the damascene structure;

a metalization layer in the damascene structure, the metalization layer consisting essentially of (111) grains, and comprising a member selected from the group consisting of copper, aluminum, and alloys thereof.

30. The damascene metal interconnect of claim 29, wherein the first barrier material is along the bottom and the side wall of the damascene structure.

31. The damascene metal interconnect of claim 29 wherein the first barrier material is selected from the group consisting of titanium nitride, tantalum nitride, tungsten nitride, and combinations thereof.

32. The damascene metal interconnect of claim 29, wherein the metalization layer is polished.

33. The damascene metal interconnect of claim 29, wherein the seed layer overhangs the side wall.

34. The damascene metal interconnect of claim 29, wherein the damascene structure comprises a barrel shaped appearance.

35. The damascene metal interconnect of claim 29, wherein the bottom of the damascene structure comprises an enhanced fill region.

36. The damascene metal interconnect of claim 29, further comprising a passivation layer over the metalization layer.

37. The damascene metal interconnect of claim 29, wherein the dielectic material comprises silicon dioxide.

38. The damascene metal interconnect of claim 29, wherein the metalization layer is separated from the seed layer by the first barrier material.

* * * * *